United States Patent [19]
Falk et al.

[11] Patent Number: 5,057,890
[45] Date of Patent: Oct. 15, 1991

[54] HALL ELEMENT

[75] Inventors: Urs Falk, Cham; Radivoje Popovic, Zug, both of Switzerland

[73] Assignee: LGZ Landis & Gyr Zug AG, Zug, Switzerland

[21] Appl. No.: 613,936

[22] Filed: Nov. 9, 1990

Related U.S. Application Data

[63] Continuation of Ser. No. 397,384, Aug. 23, 1989, abandoned.

[30] Foreign Application Priority Data

Sep. 21, 1988 [CH] Switzerland .................. 3512/88

[51] Int. Cl.[5] ............................................. H01L 27/22
[52] U.S. Cl. ....................................... 357/27; 324/252
[58] Field of Search .................... 357/27; 324/251, 252

[56] References Cited

U.S. PATENT DOCUMENTS 4,037,150 7/1977 Taranov et al. .
4,782,375 11/1988 Popovic .
4,829,352 5/1989 Popovic et al. ...................... 357/27

OTHER PUBLICATIONS

Proceedings of the IEEE, vol. 74, No. 8, Aug. 1986, pp. 1107–1132.

Primary Examiner—Andrew J. James
Assistant Examiner—Courtney A. Bowers
Attorney, Agent, or Firm—Marmorek, Guttman & Rubenstein

[57] ABSTRACT

A Hall element has a polygonal plane cross-section. In the cross-sectional plane, on the sides of the cross-section, are cross-sections of electrodes, the number of which is a multiple of four. The locations and cross-sections of the electrodes are mathematically conformal mappings into the polygonal plane cross-section of a fictitious group of non-overlapping cross-sections of electrodes in equal number transformed from a fictitious plane in which they are arranged radially symmetric on the circumference of a circle. The radius of the circle is equal to one. The fictitious group is sub-divided into groups of four within which the cross-sections of the corresponding fictitious electrodes are always at the same distances to each other on the circumference of the circle.

7 Claims, 5 Drawing Sheets

HALL ELEMENT

This is a continuation, of application Ser. No. 397,384, filed Aug. 23, 1989 now abandoned.

FIELD OF THE INVENTION

The instant invention relates to an integrated circuit Hall element having a polygonal plane cross-section and electrodes which number four or multiples of four. The instant invention has as its result an integrated circuit Hall element, with electrode cross-sections and locations which optimize its electrical functioning by reducing its "offset voltage" to a minimum.

BACKGROUND OF THE INVENTION

Hall elements of this type are known from the printed publication "Proceedings of the IEEE", Vol. 74, No. 8, August 1986, pages 1107 to 1131, "Integrated Semiconductor Magnetic Field Sensors", H. P. Baltes and R. S. Popovic, FIG. 3, in which the electrodes are arranged radially symmetric in space in relation to the center of the Hall element, so that the Hall element may also function symmetrically electrically, so that its zero voltage ("offset voltage") is theoretically always equal to zero.

U.S. Pat. No. 4,782,375 discloses integrated Hall elements whose electrodes, all of the same size, are arranged symmetrically in spac in a straight line at the surface of an integrated Hall element.

OBJECTS AND SUMMARY OF THE INVENTION

It is the object of the instant invention to modify a Hall element of the type mentioned above in such manner that the electric symmetrical functioning of this Hall element is preserved despite an asymmetrical arrangement in space of the electrodes in relation to the center of the Hall element. By means of the asymmetrical arrangement of the electrodes it is possible to realize Hall elements which can be simply integrated into a integrated circuit since all the electrodes are arranged in this case on only one side of the Hall element for example, this side the becoming the surface of the integrated circuit.

To achieve this objective, in accordance with an illustrative embodiment of the present invention, a Hall element has a cross-sectional substantially in the shape of a polygon in a cross-sectional plane. The Hall element also comprises a plurality of electrodes arranged in multiples of four and having cross-sections arranged along a side of the polygon. The positions of the electrode cross-sections arranged along a side of the polygon are approximately determined by conformal mappings of a fictitious group of non-overlapping cross-sections of fictitious electrodes equal in number to said plurality of electrodes and which are located in a fictitious plane on the circumference of a unit circle symmetrically with respect to the center of the unit circle. The fictitious electrodes are divided into groups up from four equally spaced fictitious electrodes.

DESCRIPTION OF THE DRAWINGS

Identical reference numbers designate identical parts in all the figures of the drawing.

DETAILED DESCRIPTION OF PREFERRED EMBODIMENTS

The Hall element according to the invention has a plurality of electrodes, the number of which is a multiple of four and which fall into groups of four. Each electrode group of four contains a first and a second current electrode as well as a first and a second sensor electrode. When several groups of four are present, the electrodes of same name of all groups of four are as a rule connected in parallel outside the Hall element.

Preferably four electrodes 1 to 4, which then constitute a single group of four 1; 2; 3; 4, or eight electrodes 1 to 8 constituting two groups of four 1; 2; 3; 4 and 5; 6; 7; 8 are present. In FIGS. 1 to 49 as well as in FIG. 52 the presence of four electrodes is assumed, and in FIGS. 50 to 51, the presence of eight electrodes is assumed.

Each of the FIGS. 1 to 47, 52 and 53 shows a cross-sectional plane of the Hall element according to the invention, each containing cross-sections of the four electrodes 1 to 4 or of the eight electrodes 1 to 8. The Hall element according to the invention has a polygonal cross-section 9 which is located in the mentioned crosssectional plane. Cross-sections of the electrodes 1 to 4 or of the electrodes 1 to 8 are located in the crosssectional plane, on a side of cross-section 9 of the Hall element. Each cross-sectional plane is provided with a coordinate axis u1 and with a coordinate axis u2 which is perpendicular to the former, the zero point of which coincides in each case with the center of cross-section 9 of the Hall element. Each point of the circumference of the cross-section 9 of the Hall element and each point of the cross-sections of the electrodes 1 to 4 or 1 to 8 thus has a complex value $u = u1 + j \cdot u2$ of its coordinates in the cross-sectional plane, with j representing the imaginary unit. For reasons of simplification of the drawing the coordinate axes u1 and u2 are shown only in FIGS. 1 and 52.

In an advantageous embodiment, the polygonal cross-section 9 is four-sided, and preferably rectangular or trapezoidal. In FIGS. 1 to 47 and in FIG. 52 the presence of a rectangular crosssection section 9 is assumed. FIGS. 1 to 47 thereby represent a inexhaustible list of possible arrangements of the cross-sections of the electrodes 1 to 4 in the cross-sectional plane in the presence of only four electrodes.

In all these embodiments, the cross-sections of all electrodes 1 to 4 or 1 to 8 are, mathematically, conformal mappings of a first fictitious group of non-overlapping crosssections of an equal number of first fictitious electrodes 1a to 4a or 1a to 8a transformed from a first fictitious plane into the cross-sectional plane. The fictitious electrodes 1a to 4a or 1a to 8a are here arranged in the first fictitious plane on the circumference of a circle 10 radially symmetric in relation to the center of said circle 10. The radius of the circle 10 is one. To each group of four electrodes 1 to 4 or 1 to 8, there corresponds a group of four fictitious electrodes $1a$; $2a$; $3a$; $4a$ or $5a$; $6a$; $7a$; $8a$, respectively. The first fictitious group is then subdivided into a group of four $1a$; $2a$; $3a$; $4a$ or into two groups of four $1a$; $2a$; $3a$; $4a$ and $5a$; $6a$; $7a$; $8a$. Within each group of four $1a$; $3a$; $4a$; or $5a$; $6a$; $7a$; $8a$ the cross-sections of the corresponding first fictitious electrodes $1a$ to $4a$ or $5a$ to $8a$ are at the same distances from each other on the circumference of the circle 10.

Figure 1:
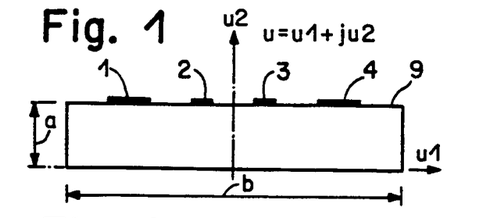
FIG. 1 to FIG. 47 each show a cross-section through different variants of a Hall element according to the invention.
Figure 2:
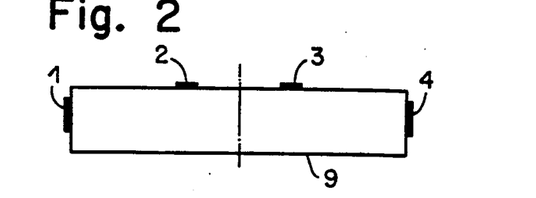
Figure 3:
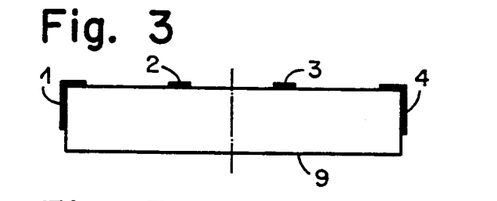
Figure 4:
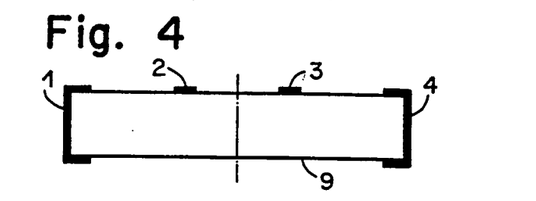
Figure 5:
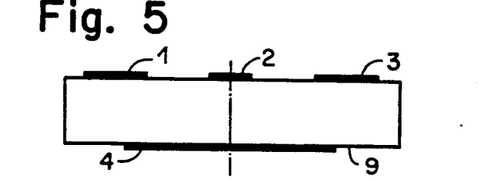
Figure 6:
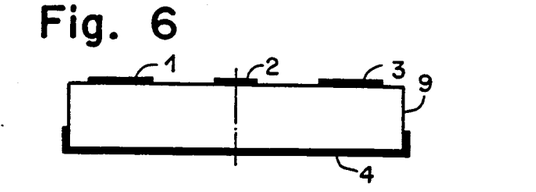
Figure 7:
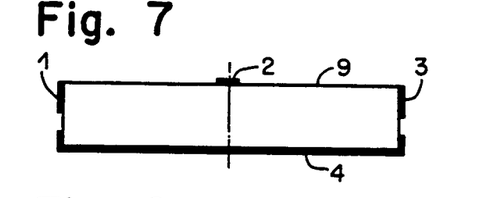
Figure 8:
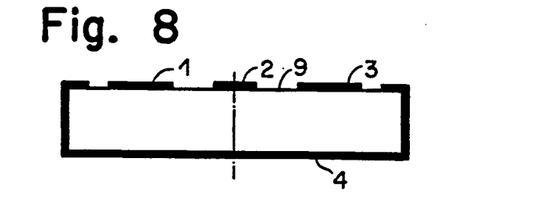
Figure 9:
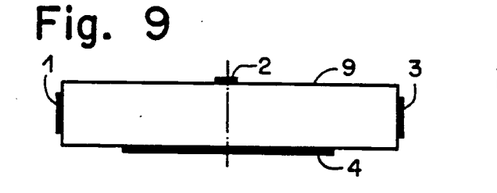
Figure 10:
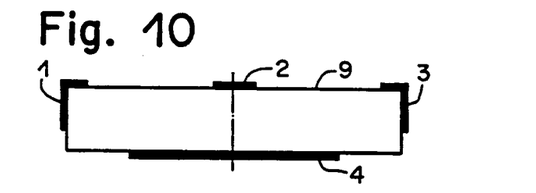
Figure 11:
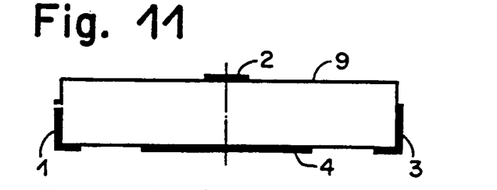
Figure 12:
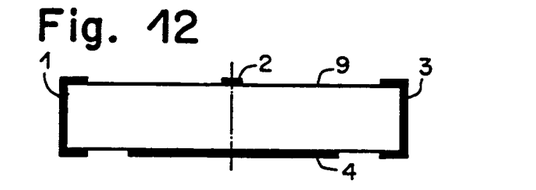
Figure 13:
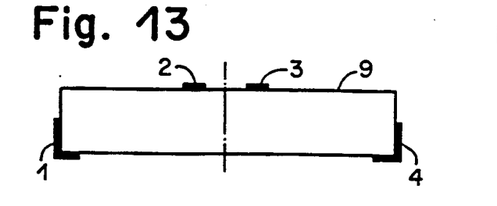
Figure 14:
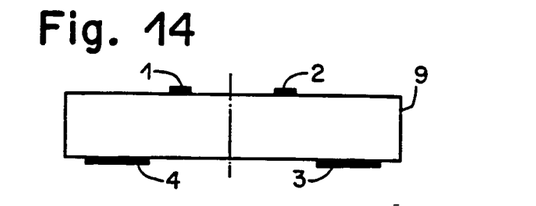
Figure 15:
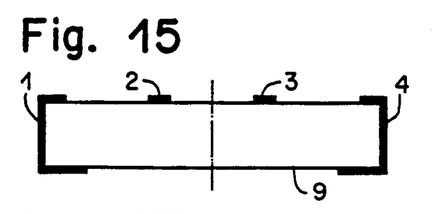
Figure 16:
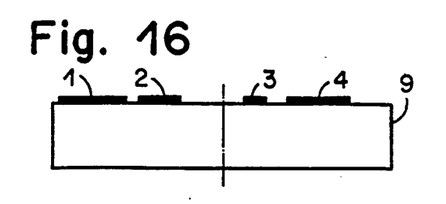
Figure 17:
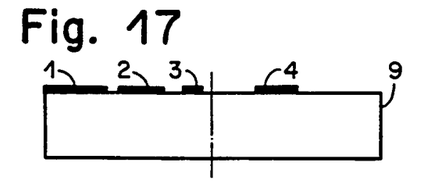
Figure 18:
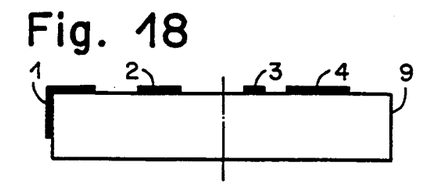
Figure 19:
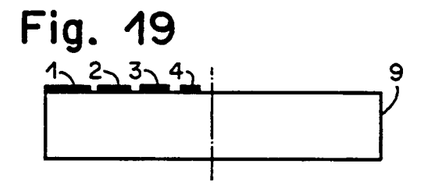
Figure 20:
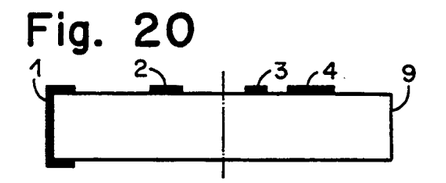
Figure 21:
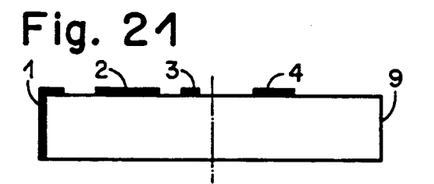
Figure 22:
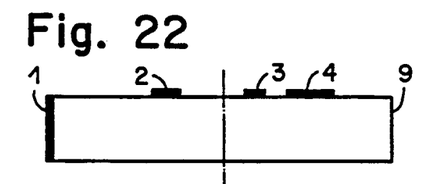
Figure 23:
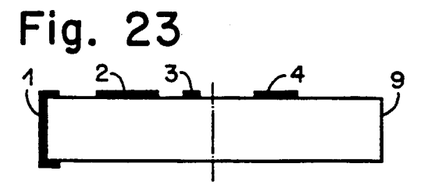
Figure 24:
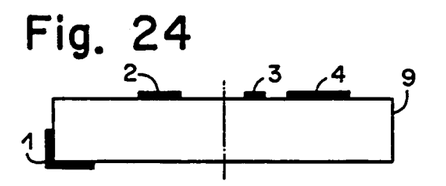
Figure 25:
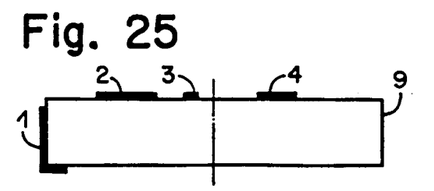
Figure 26:
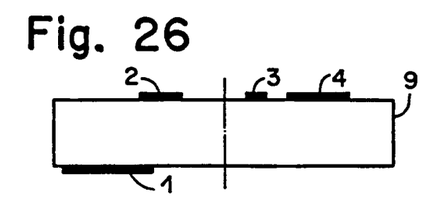
Figure 27:
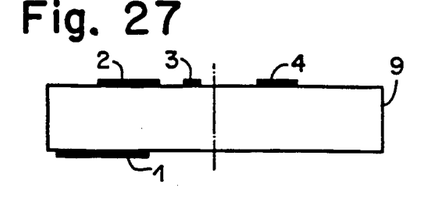
Figure 28:
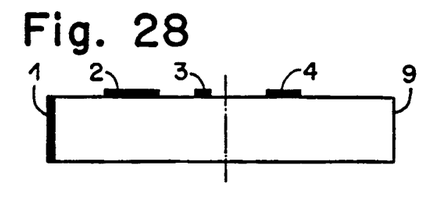
Figure 29:
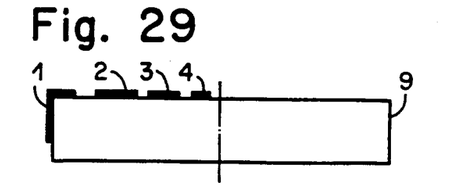
Figure 30:
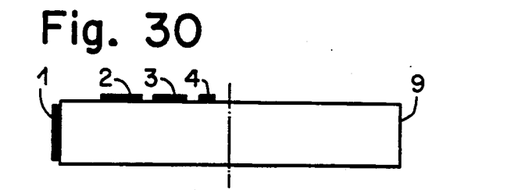
Figure 31:
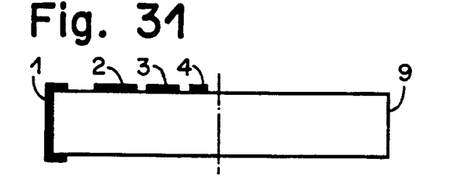
Figure 32:
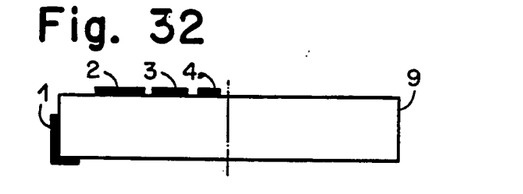
Figure 33:
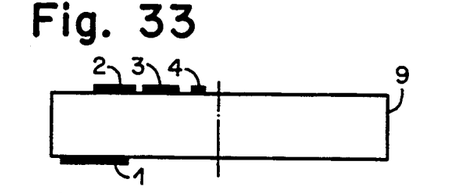
Figure 34:
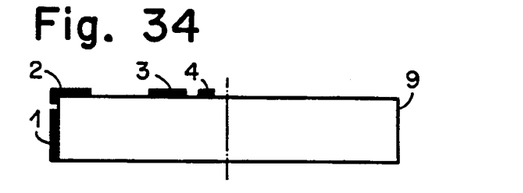
Figure 35:
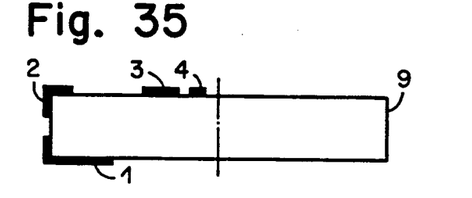
Figure 36:
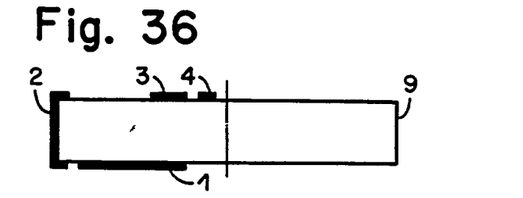
Figure 37:
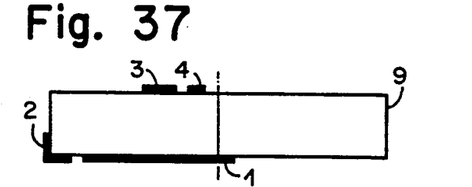
Figure 38:
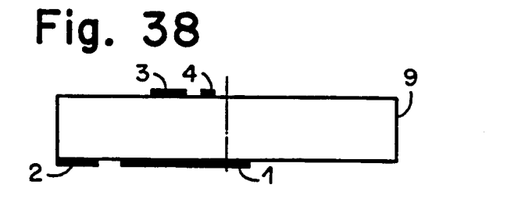
Figure 39:
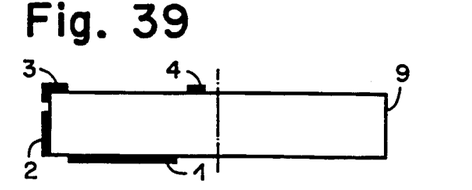
Figure 40:
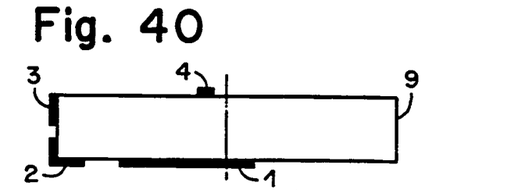
Figure 41:
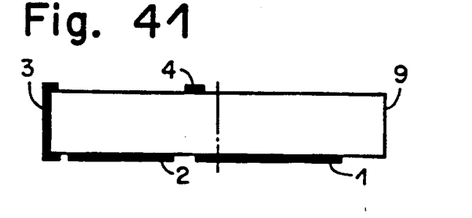
Figure 42:
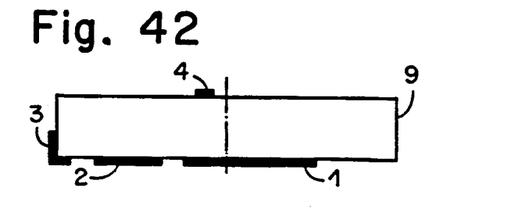
Figure 43:
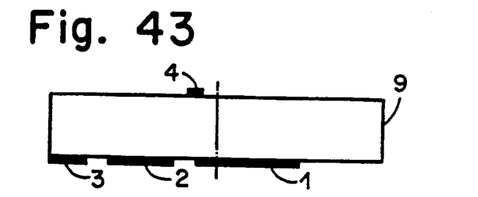
Figure 44:
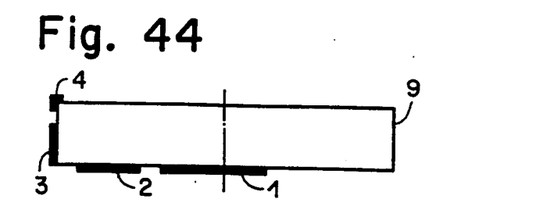
Figure 45:
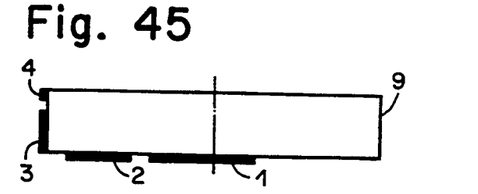
Figure 46:
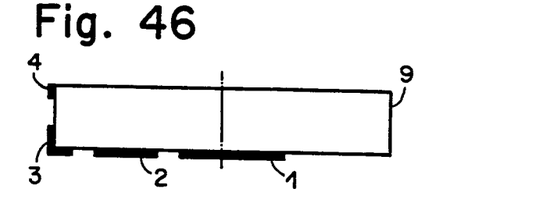
Figure 47:
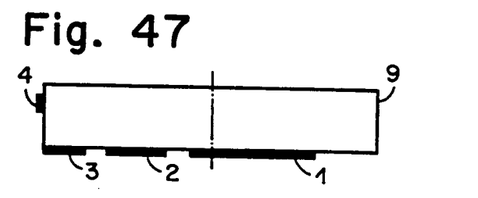
Figure 48:
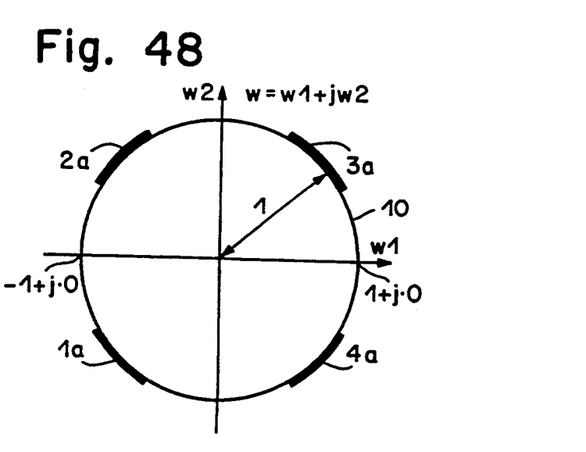
FIG. 48 shows a variant of a cross-sectional arrangement of fictitious electrodes in a w-plane.
Figure 51:
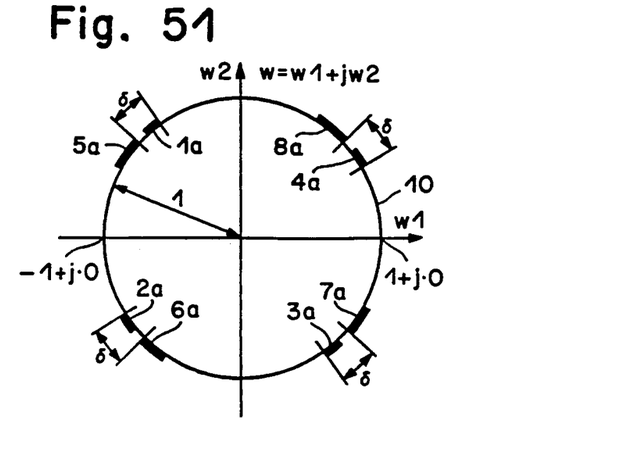
FIG. 51 shows an additional variant of a cross-sectional arrangement of fictitious electrodes in the w-plane.

In FIG. 48, for the case that only four electrodes 1 to 4 are present, the corresponding first fictitious plane is represented with the corresponding circle 10 and the corresponding first fictitious electrodes $1a$ to $4a$. Similarly, for the case that eight electrodes 1 to 8 are present, FIG. 51 shows the corresponding first fictitious plane with the corresponding circle 10 and the corresponding first fictitious electrodes $1a$ to $8a$. In FIG. 51 the group of four $5a$; $6a$; $7a$; $8a$ is displaced in rotation by a constant angle $\delta$ in relation to the group of four $1a$; $2a$; $3a$; $4a$. For the sake of simplification it was assumed in FIGS. 48 and 51 that the cross-sections of the electrodes $1a$ to $4a$ or $5a$ to $8a$ are of equal size within each group of four.

Each first fictitious plane has an imaginary coordinate axis w1 and an imaginary perpendicular coordinate axis w2, the zero point of which coincides with the center of circle 10. The circle 10 intersects the coordinate axis w1 at both points $1+j0$ and $-1+j0$. Each point of the circle 10 has a complex value $w=w1+j.w2$ of its coordinates w1, w2. The cross-sections of the first fictitious electrodes $1a$ to $4a$ or $1a$ to $8a$ are sections of circles.

With a rectangular cross-section 9 of the Hall element the first fictitious electrodes $1a$ to $4a$ shown in FIG. 48 correspond to the four electrodes 1 to 4 shown in on of the FIGS. 1 to 47, i.e. the latter are in the cross-sectional plane of one of the FIGS. 1 to 47, the mathematically conformal mappings of the first fictitious electrodes $1a$ to $4a$ shown in the first fictitious plane of FIG. 48.

Figure 52:
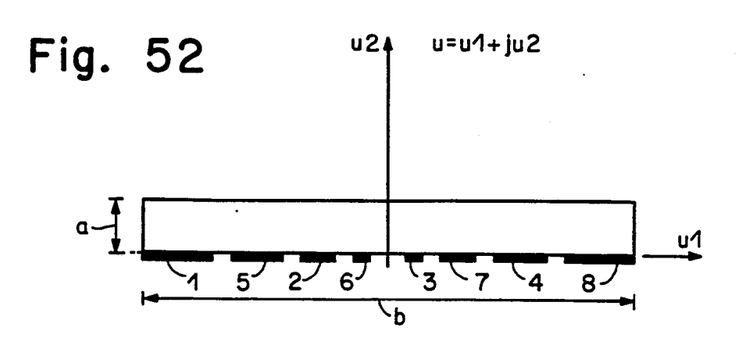
FIG. 52 shows a cross-section of the further variant of the Hall element according to the invention.

In the same way, with a rectangular cross-section 9 of the Hall element, the first fictitious electrodes $1a$ to $8a$ shown in FIG. 51 correspond to the eight electrodes 1 to 8 shown in FIG. 52, i.e. the latter are, in the cross-sectional plane of FIG. 52, the mathematically conformal mappings of the first fictitious electrodes $1a$ to $8a$ shown in the first fictitious plane of FIG 51.

In FIGS. 1 to 47 and in FIG. 52 the cross-sections of the electrodes 1 to 8 are in a straight line, L-shaped or U-shaped, depending on whether the electrode in question is placed on two sides around an edge or on three sides around two edges on the circumference of the rectangular cross-section 9.

The assumption made below is that of a rectangular crosssection 9.

Instead of transforming the first fictitious electrodes $1a$ to $4a$ of FIG. 48 directly conformal in the cross-sectional plane, this can be done via one or two intermediate steps in order to simplify the calculation and facilitate understanding.

Figure 49:
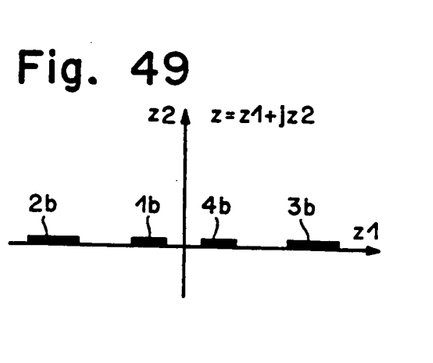
FIG. 49 shows a mathematically conformal mapping in a z-plane of the variant of the cross-sectional arrangement of fictitious electrodes shown in FIG. 48.

In the first instance, according to FIG. 49, the mathematically conforma mappings of the first fictitious electrodes $1a$ to $4a$ shown in the first fictitious plane are shown in a second fictitious plane as a second fictitious group of second fictitious electrodes $1b$ to $4b$ of equal number. In the second fictitious plane an imaginary real coordinate axis z1 and a perpendicular imaginary coordinate axis z2 are present, so that the second fictitious electrodes $1b$ to $4b$ have the complex values $z=z1+j.z2$ as coordinates. The circle 10 of the first fictitious plane corresponds to the real coordinate axis z1 in the second fictitious plane, so that the cross-sections of the second fictitious electrodes $1b$ to $4b$ in the second fictitious plane are in a straight line and also lie on the coordinate axis z1, i.e. symmetrically on it in relation to the zero point (see FIG. 49). This symmetry results in the cross-sections of the electrodes 1 to 4 being arranged axial-symmetrically in the cross-sectional plane in relation to the coordinate axis u2 on the rectangular cross-section 9 of the Hall element. The cross-sections of the electrodes 1 to 4 in the cross-sectional plane are in turn the mathematically conformal mappings of the cross-sections of the second fictitious electrodes $1b$ to $4b$ shown in the second fictitious plane.

The following equations apply to the two conformal mappings:

$$Y = -j\alpha(w+j)/(w-j) \quad (I)$$

and $$u = \frac{b}{\int_0^1 \frac{2dx}{\sqrt{(1-x^2)(1-k^2x^2)}}} \int_0^Y \frac{dx}{\sqrt{(1-x^2)(1-k^2x^2)}} \quad (II)$$

where $\alpha$ is a real parameter which can be freely selected and where the value of Y in equation II can be calculated by means of equation I. The value of k is given by the equation:

$$\frac{a}{b} = \frac{\int_0^1 \frac{dx}{\sqrt{(1-x^2)(1-x^2+k^2x^2)}}}{\int_0^1 \frac{2dx}{\sqrt{(1-x^2)(1-k^2x^2)}}} \quad (III)$$

The letter j stands here for the imaginary unit, while a and b designate the values of the lateral lengths of the rectangular cross-section 9. The parameter w designates the complex values sections of the first fictitious electrodes $1a$ to $4a$ in the first fictitious plane. The parameter z on the other hand represents the complex value $z1+j.z2$ of the coordinates of the end points of the cross-sections of the second fictitious electrodes $1b$ to $4b$ in the second fictitious plane. The parameter u designates the complex values $u1+j.u2$ of the coordinates of the end points of the cross-sections of the electrodes 1 to 4 in the crosssectional plane. The letter x stands for a variable.

By eliminating Y from the equations I and II, the following equation is obtained:

$$u = \frac{b}{\int_0^1 \frac{2dx}{\sqrt{(1-x^2)(1-k^2x^2)}}} \int_0^{-j\alpha(w+j)/(w-j)} \frac{dx}{\sqrt{(1-x^2)(1-k^2x^2)}}, \quad (IV)$$

The arrangement of the cross-sections of the electrodes 1 to 4 in the cross-sectional plane which is symmetrical in relation to the coordinate axis u2 is avoided through the second intermediate step of the following method.

Figure 50:
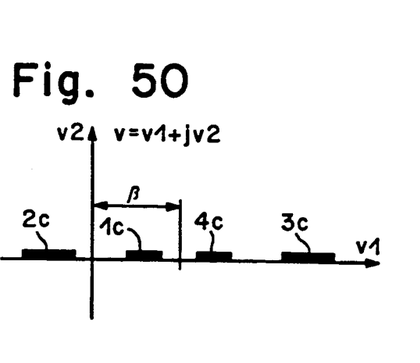
FIG. 50 shows a mathematically conformal mapping of the variant of a cross-sectional arrangement of fictitious electrodes as shown in FIG. 49, in a v-plane.

In the second instance there also exists a third fictitious plane in which an imaginary real coordinate axis v1 and a perpendicular imaginary coordinate axis v2 are provided as shown in FIG. 50. Here the coordinate axis v2 is displaced by a constant value of a real parameter $\beta$ which can be selected freely, in relation to the parallel coordinate axis z2 of the second fictitious plane, while the coordinate axes v1 and z1 coincide. The cross-sections of a third fictitious group of third fictitious electrodes 1c to 4c in this third fictitious plane are mathematically conformal mappings of the cross-sections of the second fictitious electrodes 1b to 4b shown in the second fictitious plane. The cross-sections of the third fictitious electrodes 1c to 4c lie in the third fictitious plane, all on the real coordinate axis v1, but non-symmetrically in relation to its zero point (see FIG. 50). This lack of symmetry has as a result that the cross-sections of the electrodes 1 to 4 in the cross-sectional plane are also no longer symmetrical in relation to the coordinate axis u2. The cross-sections of the electrodes 1 to 4 in the cross-sectional plane are in turn the mathematically conforma mappings of the cross-sections of the third fictitious electrodes 1c to 4c shown in the third fictitious plane.

In addition to the equations I to III, the following equation here also applies:

$$V = Z + B \qquad (V)$$

which, introduced into the equation IV, gives the following equation:

$$u = \frac{b}{\int_0^1 \frac{2dx}{\sqrt{(1-x)^2(1-k^2x^2)}}} \int_0^{-ja(w+j)/(w-j)} \frac{dx}{\sqrt{[1-(x+\beta)^2][1-k^2(x+\beta)^2]}} \qquad (VI)$$

The equation IV is here contained in the equation VI, since it corresponds to a zero value of the parameter $\beta$.

The three fictitious planes with the corresponding crosssections of fictitious electrodes 1a to 4a, 1b to 4b or 1c to 4c are always only imaginary mathematical planes which do not actually exist in space in the Hall element and only serve for the calculations.

Starting with the given values a and b of the lateral lengths of the rectangular cross-section 9, with freely selected real values of the parameters $\alpha$ and $\beta$ and with a value of k that has been calculated by means of the equation III, the equation VI yields in both cases in the cross-sectional plane the complex values u1+j.u2 of the coordinates u1, u2 of each of the two end points of the cross-sections of the electrodes 1 to 4 or, if more than four electrodes are present, of the two end points of the cross-sections of all the electrodes 1 to 8. In the advantageous first instance the value of parameter $\beta$ is here to be selected as being equal to zero.

The thus calculated end-points of the cross-sections of al the electrodes 1 to 4 or 1 to 8 are distributed as a rule irregularly over the length of the circumference of the rectangular cross-section 9, and this means that the lengths of the cross-sections of the different electrodes 1 to 4 or 1 to 8 as well as the distances between two adjoining electrodes are very different as a rule. In other words: The cross-sections of the electrodes 1 to 4 or 1 to 8 are as a rule far from being point-symmetrical in relation to the center of the rectangular cross-section 9. This complete lack of symmetry in the arrangement of the electrodes should actually lead to asymmetric electrical properties of the Hall element and therefore to zero voltages of the Hall element that are other than zero. Only due to the fact that the end points of the cross-sections of the electrodes 1 to 4 or 1 to 8 are mathematically conformal mappings of the end-points of the cross-sections of the first fictitious electrodes 1a to 4a or 1a to 8a which are point-symmetrical in relation to the center of circle 10 in the first fictitious plane, their symmetrical electrical properties are maintained during the mathematically conformal transformation, despite the resulting asymmetrical spacial structure. The resulting Hall element with the point-asymmetrically arranged cross-sections of the electrodes 1 to 4 or 1 to 8 in the cross-sectional plane thus possesses symmetrical electrical properties and its zero-voltage is therefore at least theoretically equal to zero.

Figure 53:
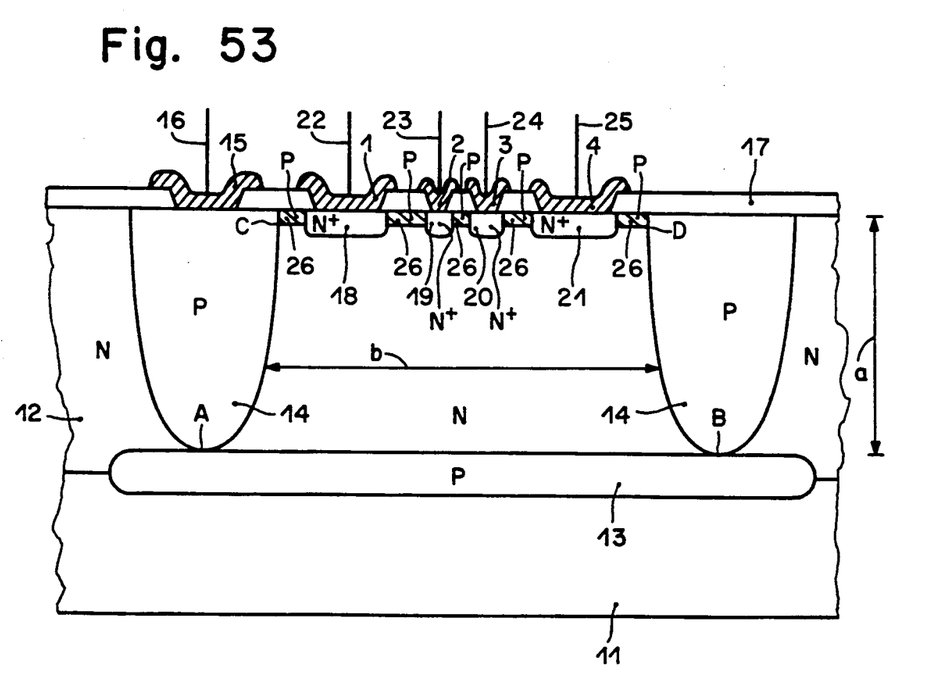
FIG. 53 shows a cross-section of an integrated Hall element according to the invention.

In many of the variant solutions thus calculated the cross-sections of all the electrodes 1 to 4 or 1 to 8 are located on only one side of the cross-section 9 (see FIGS. 1, 16, 17, 19 and 52). These variant solutions are therefore especially well suited to realize integrated Hall elements capable of being integrated into an integrated circuit for example. In this case the side of cross-section 9 on which all the electrodes 1 to 4 or 1 to 8 are located corresponds to the surface of the integrated Hall element and of the integrated circuit. A cross-section of such an integrated Hall element is shown in FIG. 53. The integrated Hall element comprises an optional substrate 11, a semiconductor layer 12 applied to the substrate 11 and the thickness of which has a value a, an optional buried layer (13) which is placed at the interface and parallel to it between substrate 11 and the semiconductor layer 12, and of a rectangular annular well 14 which is provided with a connection contact 15, for example with a connection wire 16, at the surface of the semiconductor layer 12. The surface of the semiconductor layer 12 is furthermore covered with an oxide layer 17 which is transversed by the connection contact 15 and by the four electrodes 1 to 4, whereby said four electrodes 1 to 4 are each provided with a contact diffusion 18 or 19 or 20 or 21 and each with a connection wire 22 or 23 or 24 or 25. The contact diffusions 18 to 21 are diffused into the semiconductor layer 12 at the surface and are heavily doped with impurity atoms. They are furthermore of the same material conductivity type, e.g. of type N, as the semiconductor layer 12, while the buried layer 13 and the well 14 are of the opposite material conductivity type, e.g. of type P. Furthermore a shallow layer 26 of semiconductor material is diffused into the semiconductor layer 12 at the surface of the semiconductor layer 12 and within the annular well 14, said layer 26 of semiconductor material being of the same material conductivity type, e.g. of type P, as the buried layer 13 and the well 14 and being transversed by the contact diffusions 18 to 21.

When the optional substrate 11 and the optional buried layer 13 are not present, the well 14 does not touch the bottom of the semiconductor layer 12 as shown in FIG. 53. The latter has a much greater value of a in that case.

In the drawing of FIG. 53 the well 14 touches the buried layer 13 at the points A and B as well as the surface of the semiconductor layer 12 at points C and D, among others. The area ABCD represents the cross-section 9 of the actual integrated Hall element. It is delimited at the top and at bottom by two nearly parallel sides AB and CD as well as laterally by two bent sides AC and DB. The distance between the two parallel sides AB and CD is nearly equal to the value a of the thickness of the semiconductor layer 12 because the thickness of the buried layer 13 is relatively shallow. The distance between the bent sides AC and DB is equal to value b and, contrary to a rectangular cross-section 9, is not constant. Since the value of a is very small in integrated Hall elements, the area ABCD of the cross-section 9 can be assumed to be trapezoidal or even rectangular in a first mapping whereby a median value of b must be assumed as the applicable value of b the latter case.

The Hall element can thus be made as an integrated Hall element, whereby at least in the first approximation its cross-section 9 can be assumed to be trapezoidal or rectangular. In the latter case the equations I to VI are applicable to calculate the end points of the cross-sections of the electrodes 1 to 4. The thus calculated and found coordinates u1, u2 must then be corrected slightly if necessary to take into account the not ideal rectangular configuration of the cross-section 9 of the integrated Hall element.

The electrodes 1 to 4 or 1 to 8 of the integrated Hall element are all nearly in a straight line, but contrary to the known arrangement of the above-mentioned U.S. Pat. No. 4,782,375, they are not all of equal size.

Although the offset voltage Uo of the Hall element is theoretically equal to zero, a small residual value other than zero, of the offset voltage Uo, will always be present in practice due to the asymmetries in manufacture and/or due to background noise. This residual value of the offset voltage Uo can be eliminated by one of several known methods, preferably through the method described in U.S. Pat. No. 4,037,150 hereby incorporated by reference.

In that case the electrodes 1, 2, 3 and 4 or the electrode combinations 1; 5, 2; 6, 3;7 and 4; 8 of the Hall element are connected to a reversing switch arrangement having four connections to connect the four electrodes 1 to 4 of the four electrode combinations 1;5 to 4;8, a two-pole voltage output U1; U2, a two-pole current input I1; I2 for the connection of a current source and a control input. The control input here serves to reverse switches contained in the reversing switch arrangement. The reversing switch arrangement connects the electrodes 1 to 4 or the electrode combinations 1; 5 to 4; 8 of the Hall element to the voltage output U1; U2 of the Hall element and to the source of current. The eight following different switching positions, E to M, are possible in each case:

| Switching positions | E  | F  | G  | H  | J  | K  | L  | M  |
|---|---|---|---|---|---|---|---|---|
| Electrode 1 | I1 | U2 | I2 | U1 | U2 | I1 | U1 | I2 |
| Electrode 2 | U1 | I1 | U2 | I2 | I2 | U2 | I1 | U1 |
| Electrode 3 | I2 | U1 | I1 | U2 | U1 | I2 | U2 | I1 |
| Electrode 4 | U2 | I2 | U1 | I1 | I1 | U1 | I2 | U2 |

Here I1 and I2 designate the two poles of the current input I1; I2, and U1 and U2 the two poles of the voltage output U1; U2 of a reversing switch arrangement.

A voltage difference U1(k)−U2(k) depends on the switching position k of the switch contained in the reversing switch arrangement and yields:

$$U1(k)\text{-}U2(k) = (-1)^k U_o + U_{Hall} \quad \text{(VII) with } k = 1, 2, 3 \text{ or } 4,$$
and
$$U1(k)\text{-}U2(k) = (-1)^k U_o - U_{Hall} \quad \text{(VIII) with } k = 5, 6, 7 \text{ or } 8,$$

where U1(k) and U2(k) designate the voltages at the two poles of the output voltage U1; U2 of the reversing switch arrangement and where $U_{Hall}$ is the output voltage of the Hall element.

By measuring the voltage difference U1(k)-U2(k) in any two switching positions of the reversing switch arrangement, where the offset voltage $Uo_{Hall}$ and $U_{Hall}$ have different signs in the equations VII and VIII, the offset voltage Uo can be eliminated from the two equations VII and VIII and the value of the output voltage $U_{Hall}$ of the Hall element can be determined. In that case the selected pair of switching positions can be picked from any possible existing pairs of switching positions. The measured values found through the two equations VII and VIII must be either added or subtracted here in order to obtain the output volta $U_{Hall}$ of the Hall element.

Finally, the above-described embodiments of the invention are intended to be illustrative only. Numerous alternative embodiments may be devised by those skilled in the art without departing from the spirit and scope of the following claims.

We claim:

1. A Hall element comprising a single zone of homogenous semiconductor material having a cross-sectional plane and comprising a plurality of electrodes arranged in groups of four, wherein each group of four electrodes has first and second current electrodes and first and second sensor electrodes, wherein each group of four electrodes has cross-sections arranged point asymmetrically in the cross-sectional plane in relation to the center of the polygon along at least one side of said polygon, wherein the positions of said electrode cross-sections on a side of said polygon are approximately determined by conformal mappings of a fictitious group of non-overlapping cross-sections of fictitious electrodes equal in number to said plurality of electrodes and which are located in a fictitious plane on the circumference or a unit circle symmetrically with respect to the center of the unit circle, said fictitious electrodes being divided into groups of four equally spaced fictitious electrodes.

2. The Hall element as in claim 1, wherein said plane polygon cross-section has four sides.

3. The Hall element as in claim 2, wherein said plane polygon cross-section is substantially in the shape of a trapezoid.

4. The Hall element of claim 2 wherein said polygon in said cross-sectional plane is a rectangle and wherein the coordinates (u1, u2) of each of the two endpoints of each cross-section of each of said electrodes is given by a complex value (u1+ju2) according to $$\frac{b}{\int_0^1 \frac{2dx}{\sqrt{(1-x^2)(1-k^2x^2)}}} \int_0^{-j\alpha(w+j)/(w-j)} \frac{dx}{\sqrt{[1-(x+\beta)^2][1-k^2(x+\beta)^2]}}$$

$\alpha$ and $\beta$ bare real parameters which can be selected freely, j is the imaginary unit and where a and b are two real parameters characterizing the lengths of the sides of said rectangle and where k is given by $$\frac{\int_0^1 \frac{dx}{\sqrt{(1-x^2)(1-x^2+k^2x^2)}}}{\int_0^1 \frac{2dx}{\sqrt{(1-x^2)(1-k^2x^2)}}} = \frac{a}{b}$$

where w represents the complex values (w1+jw2) of the coordinates (w1, w2) of the endpoints of the ficitious electrodes and where x is a variable.

5. The Hall element as in claim 4, wherein $\beta$ equals zero.

6. The Hall element as in claims 1, 2, 3, 4 or 5 wherein said Hall element comprises one single group of four electrodes whose locations are determined by conformal mappings from one group of four of said fictitious electrodes.

7. The Hall element of claim 1, 2, 3, 4 or 5 wherein said Hall element comprises two groups of four electrodes whose locations are determined by conformal mappings of two groups of four of said fictitious electrodes.

* * * * *